United States Patent
Tseng et al.

(10) Patent No.: US 8,049,247 B2
(45) Date of Patent: Nov. 1, 2011

(54) ASYMMETRIC BIDIRECTIONAL SILICON-CONTROLLED RECTIFIER

(75) Inventors: Tang-Kuei Tseng, Jhudong Township, Hsinchu County (TW); Che-Hao Chuang, Hsinchu (TW); Ryan Hsin-Chin Jiang, Taipei (TW); Ming-Dou Ker, Jhu-bei (TW)

(73) Assignee: Amazing Microelectronic Corp., Taipei County (TW)

( * ) Notice: Subject to any disclaimer, the term of this patent is extended or adjusted under 35 U.S.C. 154(b) by 590 days.

(21) Appl. No.: 12/113,410

(22) Filed: May 1, 2008

(65) Prior Publication Data

US 2009/0032837 A1   Feb. 5, 2009

(30) Foreign Application Priority Data

Jul. 31, 2007  (TW) ............................. 96127913 A

(51) Int. Cl.
   *H01L 29/747* (2006.01)
(52) U.S. Cl. ........................................ 257/110
(58) Field of Classification Search ............. 257/110, 257/112, 121, 371, 372, 355, E27.052, E27.079, 257/E29.036–E29.038, E29.046–E29.048, 257/E29.115, E29.196, E29.211–E29.225, 257/120, E27.135, E27.138, E21.361, E21.097, 257/E21.104, E21.121, E21.372, E21.411–E21.416
See application file for complete search history.

(56) References Cited

U.S. PATENT DOCUMENTS

| | | | |
|---|---|---|---|
| 5,072,273 | A | 12/1991 | Avery |
| 6,258,634 | B1 | 7/2001 | Wang et al. |
| 6,365,924 | B1 | 4/2002 | Wang et al. |
| 6,960,792 | B1 | 11/2005 | Nguyen |
| 7,034,363 | B2 | 4/2006 | Chen |
| 7,145,187 | B1 | 12/2006 | Vashchenko et al. |
| 2005/0045957 | A1* | 3/2005 | Kao ............................ 257/360 |
| 2008/0116480 | A1* | 5/2008 | Glenn et al. .................. 257/168 |

* cited by examiner

*Primary Examiner* — Dao H Nguyen
*Assistant Examiner* — Tram H Nguyen
(74) *Attorney, Agent, or Firm* — Ming Chow; Sinorica, LLC

(57) ABSTRACT

The present invention discloses an asymmetric bidirectional silicon-controlled rectifier, which comprises: a second conduction type substrate; a first conduction type undoped epitaxial layer formed on the substrate; a first well and a second well both formed inside the undoped epitaxial layer and separated by a portion of the undoped epitaxial layer; a first buried layer formed in a junction between the first well and the substrate; a second buried layer formed in a junction between the second well and the substrate; a first and a second semiconductor area with opposite conduction type both formed inside the first well; a third and a fourth semiconductor area with opposite conduction type both formed inside the second well, wherein the first and second semiconductor areas are connected to the anode of the silicon-controlled rectifier, and the third and fourth semiconductor areas are connected to the cathode of the silicon-controlled rectifier.

10 Claims, 8 Drawing Sheets

US 8,049,247 B2

ASYMMETRIC BIDIRECTIONAL SILICON-CONTROLLED RECTIFIER

BACKGROUND OF THE INVENTION

1. Field of the Invention

The present invention relates to a silicon-controller rectifier, particularly to an asymmetric bidirectional silicon-controlled rectifier, which has a small area, adjustable trigger voltage and high electrostatic-discharge protection capability. The proposed silicon-controller rectifier can apply to an ESD protection element for I/O ports with signal of positive and negative voltage.

2. Description of the Related Art

With the increasing request of transistors count, CMOS (Complementary Metal Oxide Semiconductor) have been developed to a submicron or even deep-submicron scale. The thin gate oxide layer of the submicron or deep-submicron technology is easy to damage under higher voltage level. In common conditions, the electrostatic discharge (ESD) voltage may cause several thousands voltage, which will easily damage integrated circuits (IC) product.

The silicon-controlled rectifier with a low turn-on resistance, low capacitance, low power consumption and high-power current conduction capability is an effective ESD protection device for IC product.

Currently, the bidirectional silicon-controlled rectifier (SCR) has become the mainstream of the ESD protection circuits for I/O ports with signal of positive and negative voltage. Moreover, many publications and researches are also dedicated to the bidirectional silicon-controlled rectifier. For example, U.S. Pat. No. 6,258,634, No. 6,365,924 and No. 7,034,363, all disclosed symmetric bidirectional silicon-controlled rectifiers, which have lower ESD robustness because they are all directly fabricated on a silicon substrate. Due to symmetric structures of symmetric SCR, large layout consumption will be cost issue. Therefore, the SCR disclosed above only apply to a generic IC process. U.S. Pat. No. 6,960,792 disclosed a symmetric bidirectional SCR with annular structure, which needs a larger layout area under the fabricated process, which cannot provide an effective ESD protection because the trigger-on speed is deeply influenced by the structure thereof. U.S. Pat. No. 5,072,273 disclosed a low trigger voltage silicon-controlled rectifier, which is unidirectional application for positive voltage signal only. U.S. Pat. No. 7,145,187 disclosed a special structure of silicon-controlled rectifier, which is hard to mass production.

Accordingly, the present invention proposes a novel asymmetric bidirectional silicon-controlled rectifier to solve the problem mentioned above.

SUMMARY OF THE INVENTION

The primary objective of the present invention is to provide an asymmetric bidirectional silicon-controlled rectifier, which can prevent electrostatic charge from damaging a semiconductor device.

Another objective of the present invention is to provide an asymmetric bidirectional silicon-controlled rectifier, which has high capability of electrostatic discharge (ESD) protection with small layout area.

Yet another objective of the present invention is to provide an asymmetric bidirectional silicon-controlled rectifier, which has an adjustable trigger voltage and holding voltage to implement a better protection design.

Still another objective of the present invention is to provide an asymmetric bidirectional silicon-controlled rectifier, which has an embedded MOS structure to improve the turn-on speed and a high ESD protection capability.

Further another objective of the present invention is to provide an asymmetric bidirectional silicon-controlled rectifier, which applies in high voltage I/O ports with signals of both positive and negative voltage.

Still further another objective of the present invention is to provide an asymmetric bidirectional silicon-controlled rectifier, which has a small parasitic capacitance to reduce signal loss.

To achieve the abovementioned objectives, the present invention proposes an asymmetric bidirectional silicon-controlled rectifier, which comprises: a second conduction type substrate; a first conduction type undoped epitaxial layer formed on the substrate; a second conduction type first well and a second conduction type second well both formed inside the epitaxial layer and separated by a portion of the undoped epitaxial layer; a first buried layer formed in a junction between the first well and the substrate; a second buried layer formed in a junction between the second well and the substrate; both a first semiconductor area and a second semiconductor with opposite conduction type formed inside the first well; both a third semiconductor area and a fourth semiconductor area with opposite conduction type formed inside the second well, wherein the first and second semiconductor areas are connected to the anode of the silicon-controlled rectifier, and the third and fourth semiconductor areas are connected to the cathode of the silicon-controlled rectifier. The proposed asymmetric bidirectional silicon-controlled rectifier has high ESD robustness per unit area. Further, the present invention can adjust the trigger voltage and the holding voltage by inserting a trigger area and a gate structure, respectively.

The present invention also proposes another asymmetric silicon-controlled rectifier, which comprises: a second conduction type substrate; a first conduction type undoped epitaxial layer formed on the substrate; a second conduction type first well and a second conduction type second well both formed inside the epitaxial layer and separated by a portion of the undoped epitaxial layer; a first buried layer and a second buried layer formed on the bottoms of the first well and the second well respectively; a first semiconductor area and a second semiconductor area both formed inside the first well, wherein the conduction type of the first semiconductor area is opposite to that of the second semiconductor area; a sixth semiconductor area having a conduction type identical to that of the second semiconductor area and formed in a junction between the first well and the separating undoped epitaxial layer, and a first gate is formed over a region between the second and sixth semiconductor areas; a third semiconductor area and a fourth semiconductor area both formed inside the second well, wherein the third semiconductor is in the external side of the fourth semiconductor area and has a conduction type opposite to that of the fourth semiconductor area; and a seventh semiconductor area having a conduction type identical to that of the fourth semiconductor area and formed in a junction between the second well and the separating undoped epitaxial layer, and a second gate is formed over a region between the fourth and seventh semiconductor areas.

The present invention also proposes further another asymmetric silicon-controlled rectifier, which comprises: a second conduction type substrate; a first conduction type undoped epitaxial layer formed on the substrate; a second conduction type first well and a second conduction type second well both formed inside the epitaxial layer, wherein both sides of the first and second wells have portions of the undoped epitaxial layer; a first buried layer and a second buried layer formed on the bottoms of the first well and the second well respectively; a first semiconductor area and a second semiconductor area both formed inside the first well, wherein the conduction type of the first semiconductor area is opposite to that of the second semiconductor area; a sixth semiconductor area having a conduction type identical to that of the first semiconductor area and formed in a junction between the first well and the separating undoped epitaxial layer, and a first gate is formed over a region between the second and sixth semiconductor areas; a third semiconductor area and a fourth semiconductor area both formed inside the second well, wherein the third semiconductor is in the external side of the fourth semiconductor area and has a conduction type opposite to that of the fourth semiconductor area; and a seventh semiconductor area having a conduction type identical to that of the third semiconductor area and formed in a junction between the second well and the separating undoped epitaxial layer, wherein a second gate is formed over a region between the fourth and seventh semiconductor areas.

Below, the embodiments will be described in detail to make easily understood the objectives, technical contents, characteristics and accomplishments of the present invention.

DETAILED DESCRIPTION OF THE INVENTION

Figure 1:
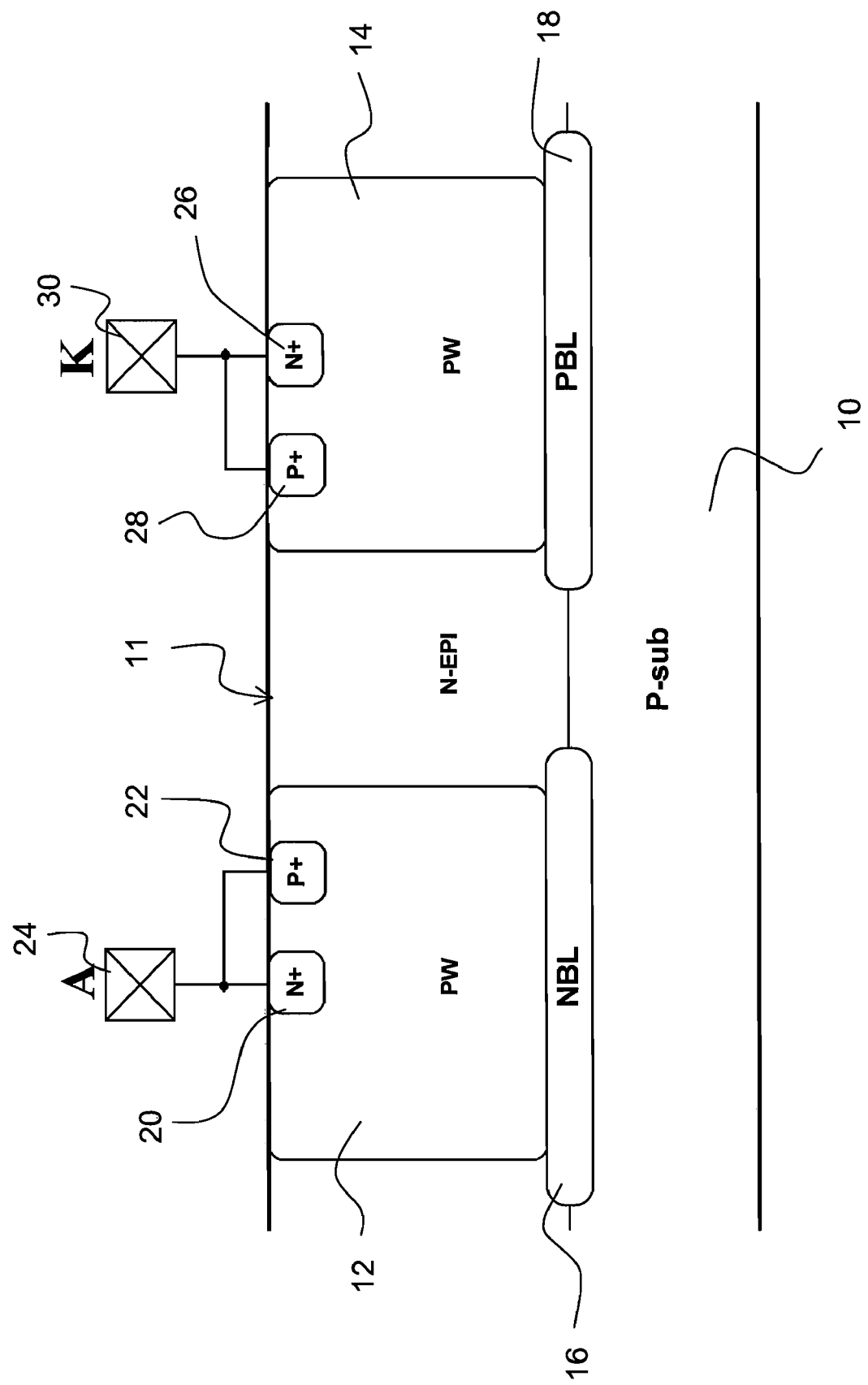
FIG. 1 is a diagram schematically showing an embodiment of an asymmetric silicon-controlled rectifier according to the present invention.

Refer to FIG. 1 a diagram schematically showing an embodiment of an asymmetric silicon-controlled rectifier according to the present invention. In this embodiment, the asymmetric silicon-controlled rectifier of the present invention comprises: a P-type substrate 10; an N-type undoped epitaxial layer 11 formed on the substrate 10; a P-type first well 12 and a P-type second well 14 formed inside the undoped epitaxial layer 11 via a doping method, wherein both sides of the first and second wells 12 and 14 have portions of the undoped epitaxial layer 11 for separation; an N-type buried layer 16 formed on the bottom of the first well 12 and a P-type buried layer 18 formed on the bottom of the second well 14; a first semiconductor area 20 and a second semiconductor area 22 respectively having a conduction type opposite to each other, wherein both of them are formed inside the first well 12 and connected to an anode 24; a third semiconductor area 26 and a fourth semiconductor area 28 having a conduction type opposite to each other, wherein both of them are formed inside the second well 14 and connected to a cathode 30.

In this embodiment, the first and third semiconductor areas 20 and 26 are N-type, and the second and fourth semiconductor areas 22 and 28 are P-type. The region at the first well 12 and near the separating undoped epitaxial layer 11 can be the first semiconductor area 20 or the second semiconductor area 22. The region at the second well 14 and near the separating undoped epitaxial layer 11 can be the third semiconductor area 26 or the fourth semiconductor area 28.

In the above description, the conduction type of the second buried layer 18 is different from that of the first buried layer 16. However, the conduction type of the second buried layer 18 may also be identical to that of the first buried layer 16. Besides, the N-type undoped epitaxial layer 11 may also be replaced by a doped well.

Further, each abovementioned semiconductor area may have separation structures (not shown in the drawings), such as oxide layers, separating shallow trenches, or undoped semiconductor areas. In this embodiment, an N-type semiconductor element and a P-type identical semiconductor element can be interchanged. For example, when the conduction type of the substrate 10 is changed from P-type to N-type, the conduction type of the first buried layer 16 should be changed from N-type to P-type, and the conduction type of the second buried layer 18 should be changed to from P-type to N-type; the conduction type of the undoped epitaxial layer 11 should be changed from N-type to P-type; the conduction type of the first and second wells 12 and 14 should be changed from P-type to N-type. Similarly, the following embodiments also have the same characteristic of conduction type interchangeability.

Figure 2:
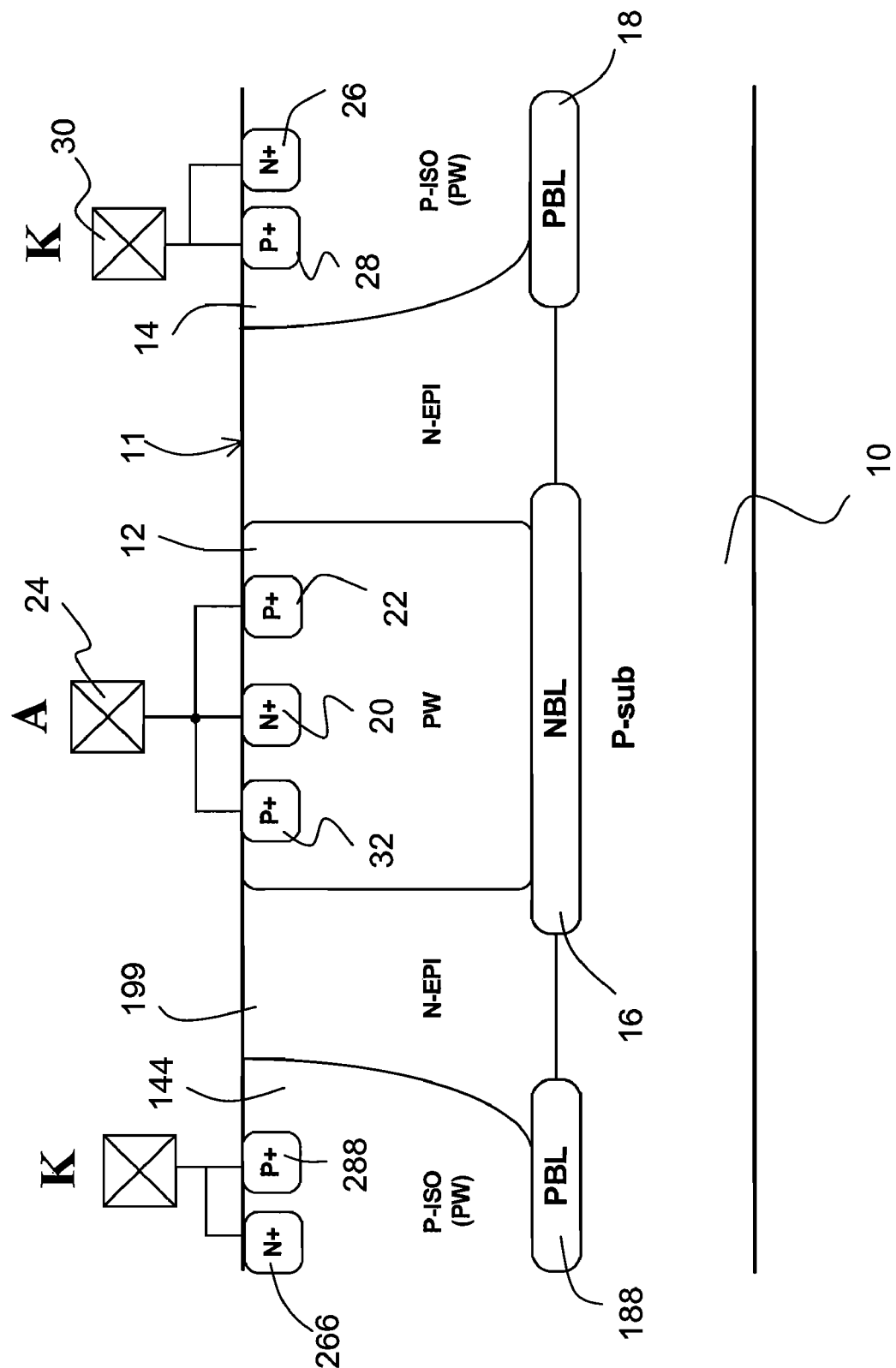
FIG. 2 is a diagram schematically showing another embodiment of an asymmetric silicon-controlled rectifier according to the present invention.

Refer to FIG. 2 a diagram schematically showing another embodiment according to the present invention. In this embodiment, the right half of the structure shown in FIG. 1 is mirrored into the left half structure shown in FIG. 2 with the mirror passing through the first semiconductor area 20. Thus, a P-type fifth semiconductor area 32 is formed in the first well 12; a third buried layer 188 and a third well 144 are formed on the left half structure shown in FIG. 2; a P-type semiconductor area 288 and a N-type semiconductor area 266 are formed inside third well 144. The fifth semiconductor area 32, the first semiconductor areas 20 and the second semiconductor area 22 are connected to an anode. The N-type semiconductor area 266 and the P-type semiconductor area 288 are connected to a cathode. As the whole structure is mirror-symmetric with respect to the N-type semiconductor area 20, half structures will be used to describe the structures of the embodiments of the present invention below.

Figure 3:
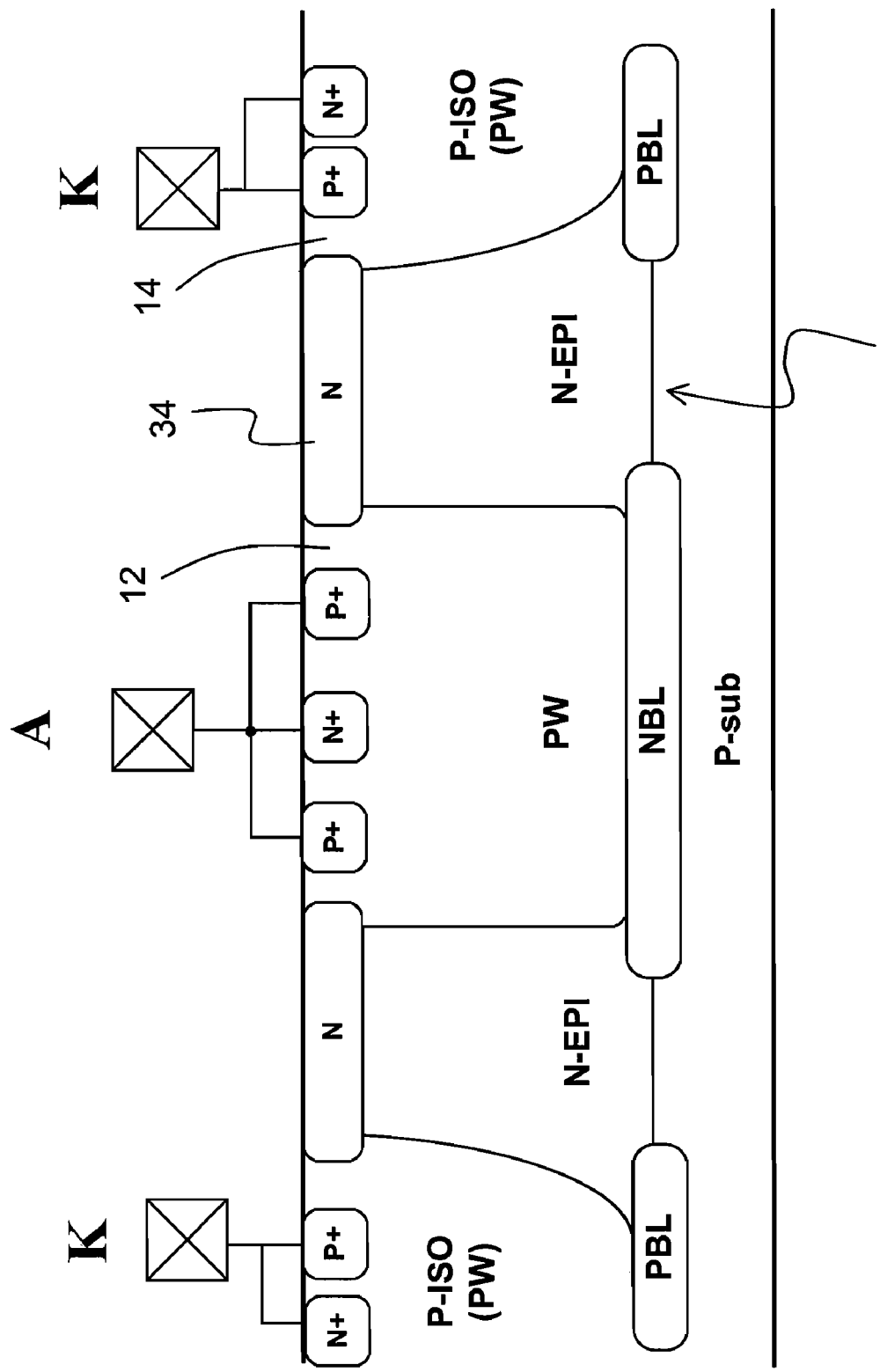
FIG. 3 is a diagram schematically showing yet another embodiment of an asymmetric silicon-controlled rectifier according to the present invention.

Refer to FIG. 3 a diagram schematically showing yet another embodiment according to the present invention. An N-type doped region 34 may be formed on the surface of a part of the epitaxial layer 11 between the first well 12 and the second well 14, wherein the ion concentration of the N-type doped region 34 is greater than that of the undoped epitaxial layer 11. Thereby, the trigger voltage can be regulated.

Figure 4:
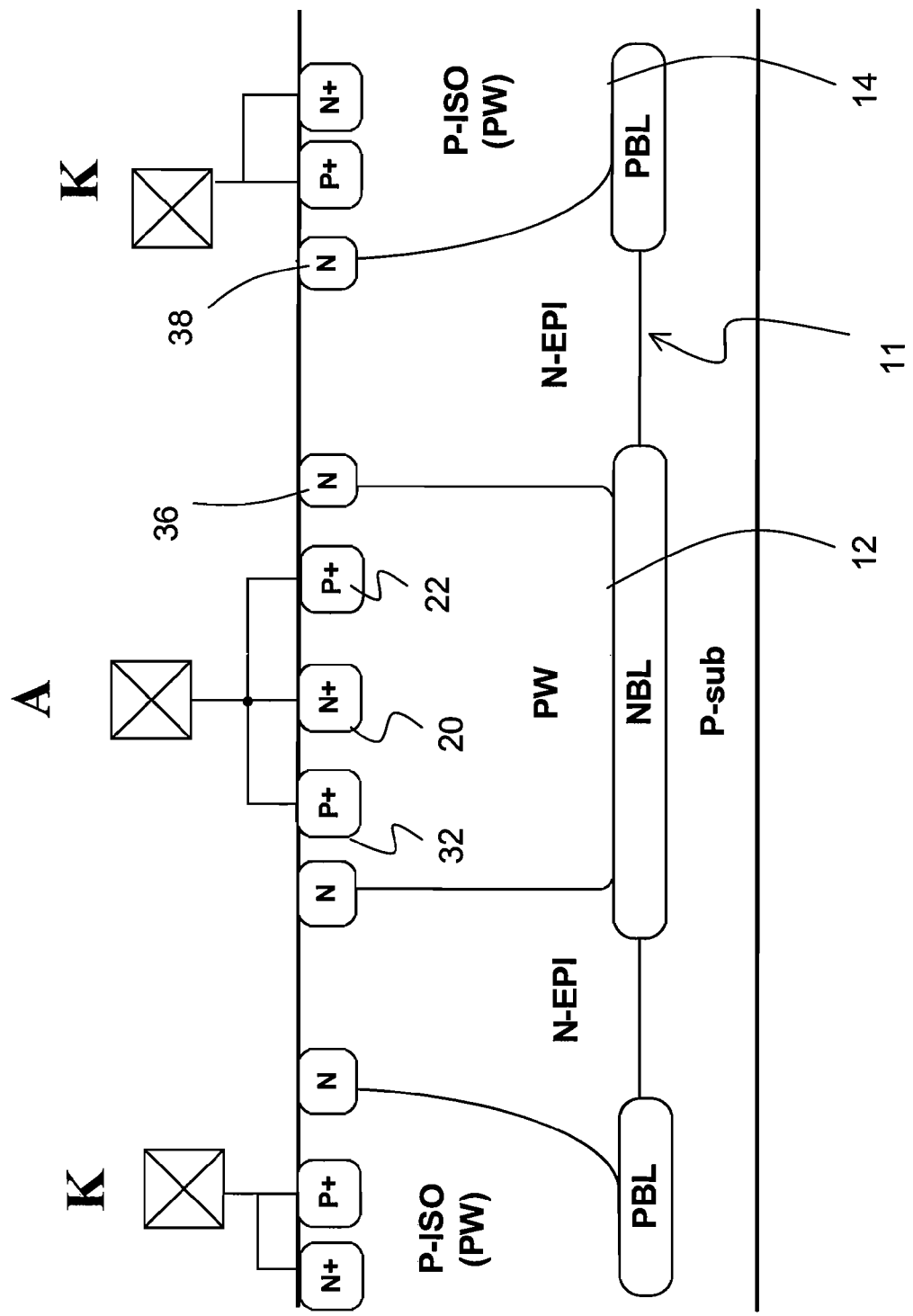
FIG. 4 is a diagram schematically showing still another embodiment of an asymmetric silicon-controlled rectifier according to the present invention.

Refer to FIG. 4 a diagram schematically showing still another embodiment according to the present invention. For regulating the trigger voltage, a sixth semiconductor area 36 having a conduction type identical to that of the first semiconductor area 20 is formed in a junction between the first well 12 and the separating undoped epitaxial layer 11; a seventh semiconductor area 38 having a conduction type identical to that of the third semiconductor area 26 is formed in a junction between the second well 14 and the separating undoped epitaxial layer 11.

Figure 5:
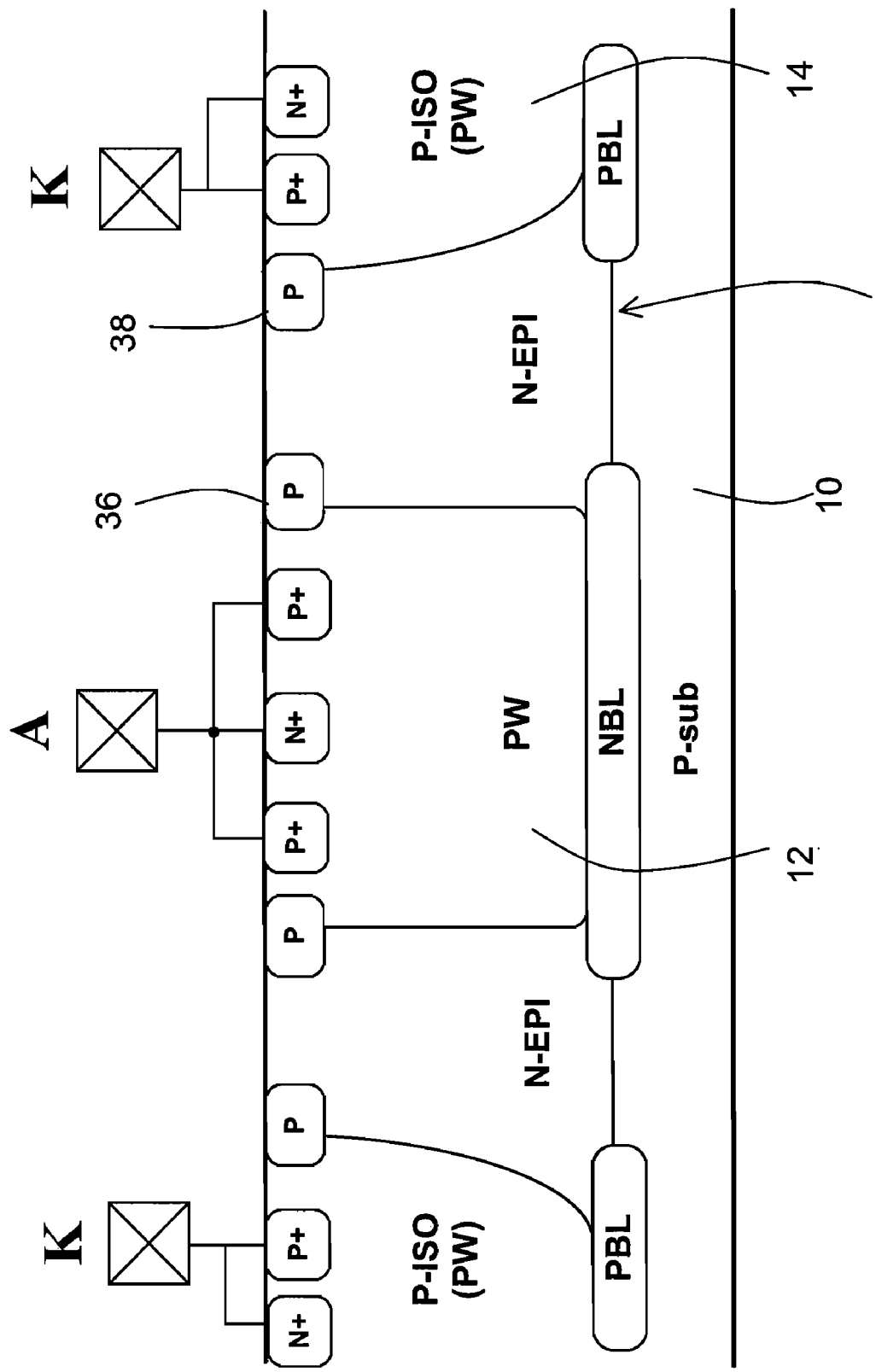
FIG. 5 is a diagram schematically showing further another embodiment of an asymmetric silicon-controlled rectifier according to the present invention.

Refer to FIG. 5 a diagram schematically showing further another embodiment according to the present invention. The abovementioned sixth and seventh semiconductor areas 36 and 38 may also be P-type. However, for reducing the breakdown voltage, the ion concentrations of the sixth and seventh semiconductor areas 36 and 38 should be greater than that of the first and second wells 12 and 14 in this embodiment.

Figure 6:
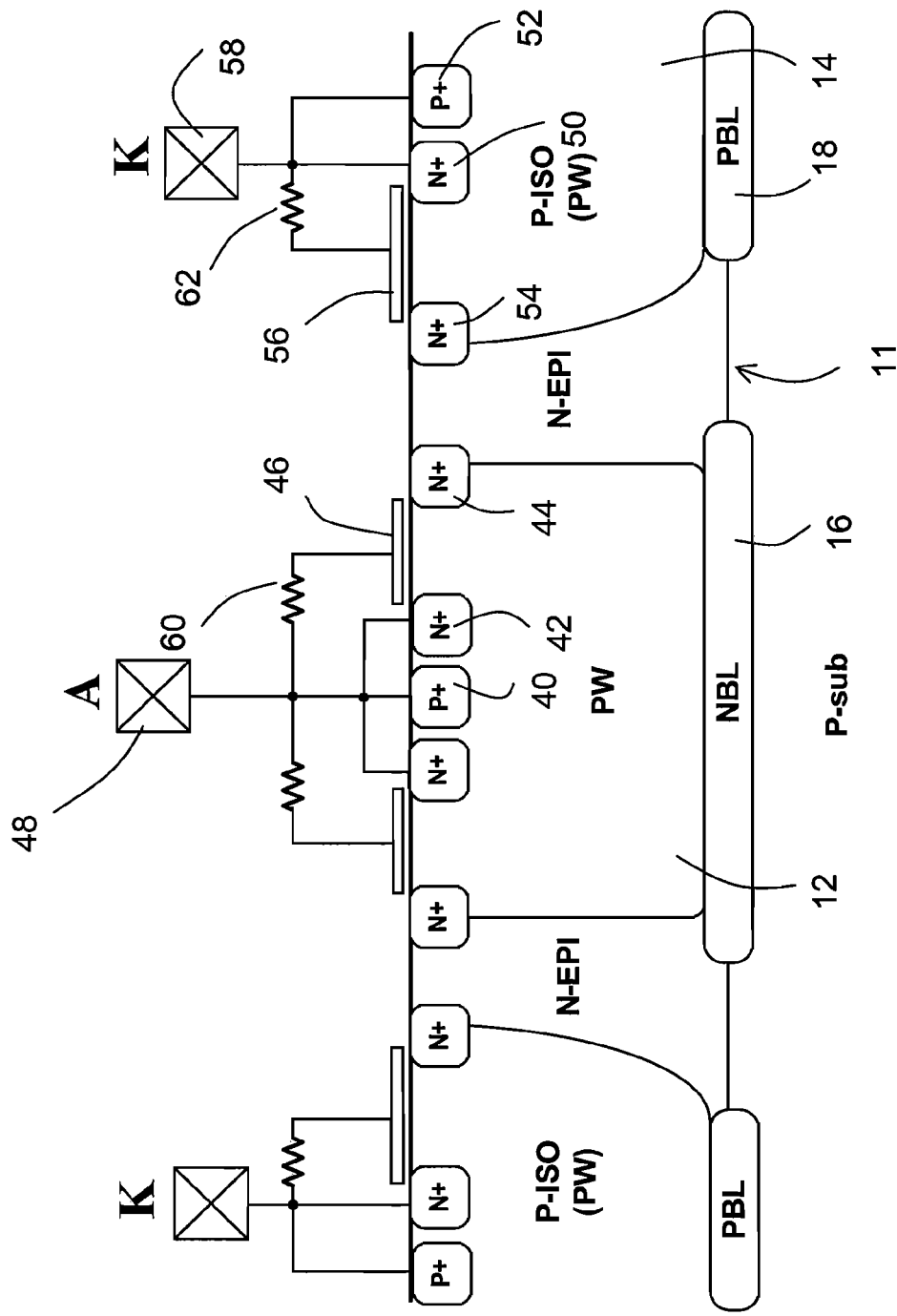
FIG. 6 is a diagram schematically showing further another embodiment of an asymmetric silicon-controlled rectifier according to the present invention.

Refer to FIG. 6 a diagram schematically showing further another embodiment of a fast-start asymmetric silicon-controlled rectifier according to the present invention. The asymmetric SCR of this embodiment comprises: a P-type substrate 10; an N-type undoped epitaxial layer 11 formed on the substrate 10; a P-type first well 12 and a P-type second well 14 formed inside the undoped epitaxial layer 11, wherein both sides of the first and second wells 12 and 14 have portions of the undoped epitaxial layer 11 for separation; an N-type buried layer 16 formed on the bottom of the first well 12 and a P-type buried layer 18 formed on the bottom of the second well 14; a P-type first semiconductor area 40 and an N-type second semiconductor area 42 both formed inside the first well 12 and near the surface of the first well 12; an N-type sixth semiconductor area 44 formed in a junction between the first well 12 and the separating undoped epitaxial layer 11; a first gate 46 formed over a region between the sixth semiconductor area 44 and the second semiconductor area 42, wherein the first gate 46, the first semiconductor area 40 and the second semiconductor area 42 are connected to an anode 48; an N-type fourth semiconductor area 50 and a P-type third semiconductor area 52 are formed inside the second well 14 and near the surface thereof; an N-type seventh semiconductor area 54 formed in a junction between the second well 14 and the separating undoped epitaxial layer 11; a second gate 56 formed over a region between the seventh semiconductor area 54 and the fourth semiconductor area 50, wherein the second gate 56, the fourth semiconductor 50 and the fifth semiconductor area 52 are connected to a cathode 58.

In this embodiment, the first gate 46 may connect to the anode 48 via a resistor 60 cascaded to the first gate 46, and the second gate 58 may connect to the cathode 58 via a resistor 62 cascaded to the second gate 58.

Further, separation structures are formed between the abovementioned semiconductor areas. In this embodiment, the gate structures are used to improve the turn-on speed of the SCR.

Figure 7:
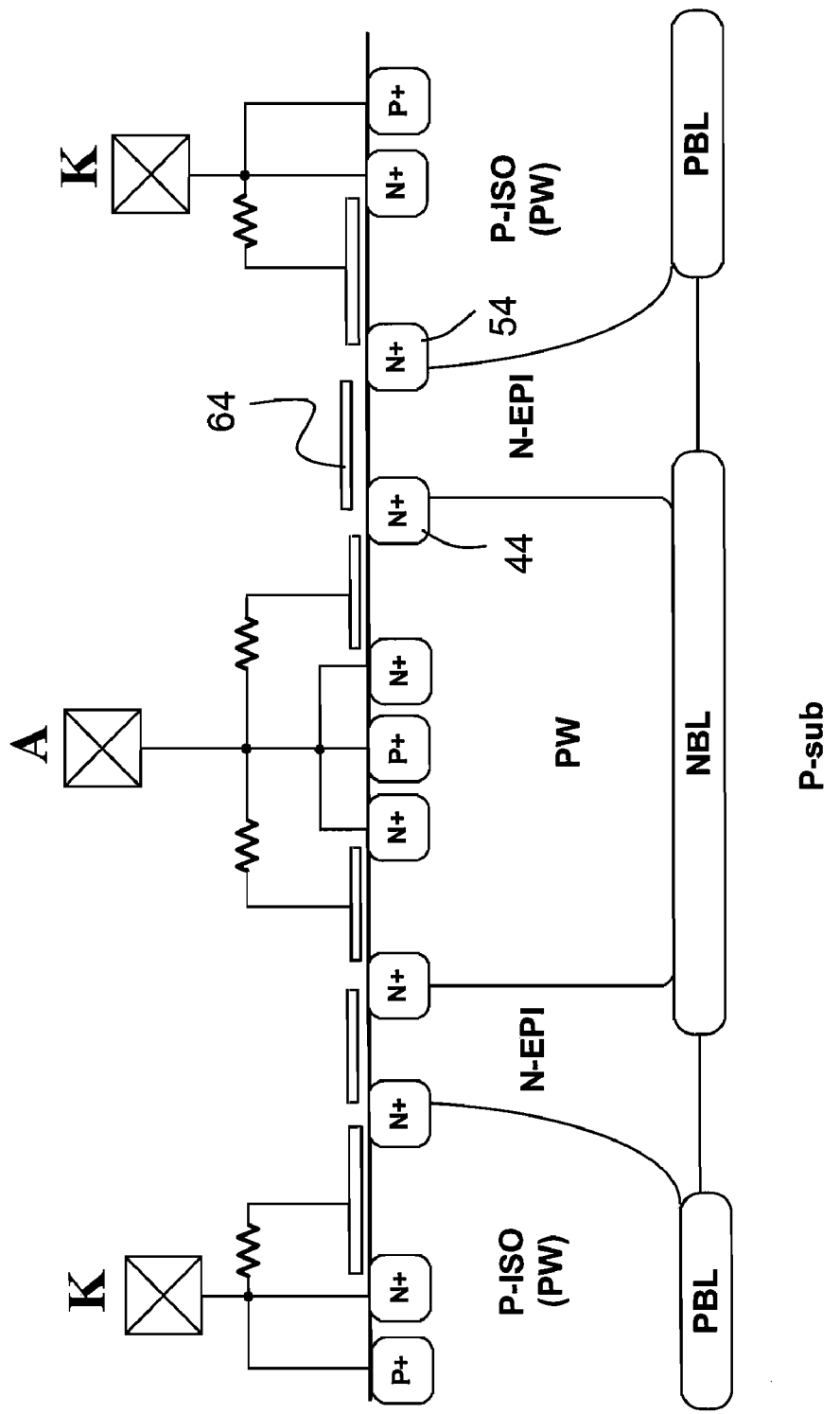
FIG. 7 is a diagram schematically showing further another embodiment of an asymmetric silicon-controlled rectifier according to the present invention.

Refer to FIG. 7 a diagram schematically showing further another embodiment according to the present invention, wherein a floating gate 64 is formed over a region between the sixth semiconductor area 44 and the seventh semiconductor area 54 of the structure shown in FIG. 6. In this embodiment, a very precision gate fabrication process is used to decrease the spacing between the sixth semiconductor area 44 and the seventh semiconductor area 54. Thereby, the holding voltage is decreased, and the protection capability is improved.

Figure 8:
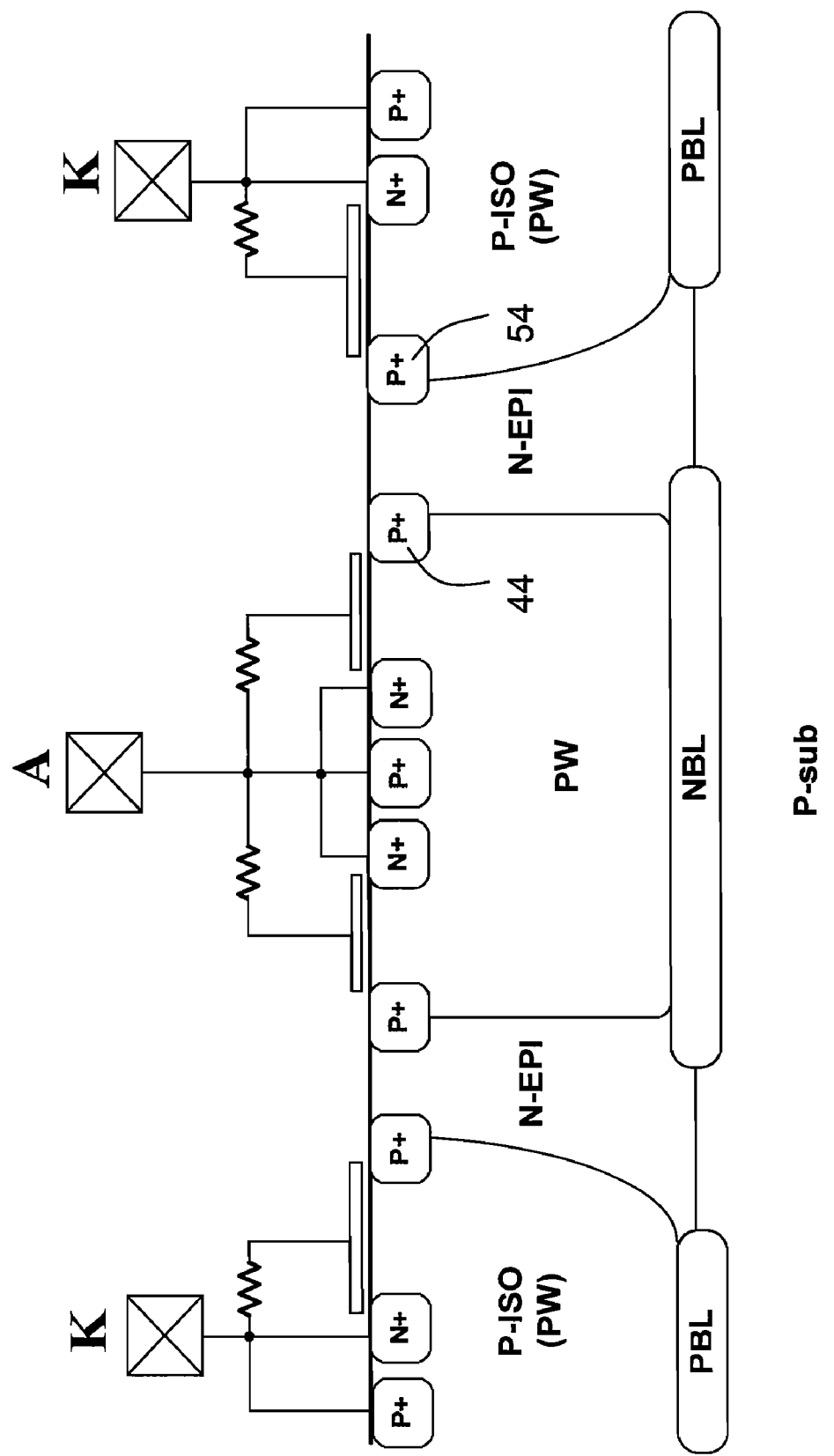
FIG. 8 is a diagram schematically showing still further another embodiment of an asymmetric silicon-controlled rectifier according to the present invention.

Refer to FIG. 8 a diagram schematically showing still further another embodiment according to the present invention, wherein the conduction types of the sixth semiconductor area 44 and the seventh semiconductor area 54 in FIG. 6 are changed to be P-type. Similarly, a gate may be additionally formed over a region between the sixth semiconductor area 44 and the seventh semiconductor area 54 to adjust the holding voltage.

In conclusion, the present invention discloses an asymmetric bidirectional silicon-controlled rectifier, wherein the elements thereof can be fabricated with the deep submicron semiconductor technology to greatly reduce the area thereof and achieve a high ESD protection capability. Further, the silicon-controlled rectifier of the present invention has an adjustable trigger voltage and an adjustable holding voltage and can be applied to all process generations. Besides, the present invention improves the turn-on speed and protection capability via forming a gate structure. The present invention can apply to a high-voltage CMOS chip to function as a protection element for I/O ports subject to both positive and negative voltage signals. Furthermore, the present invention can reduce leakage current, parasitic capacitance and signal loss during operation.

Those described above are only the preferred embodiments to exemplify the present invention but not to limit the scope of the present invention. Any equivalent modification or variation according to the spirit of the present invention is to be also included within the scope of the present invention.

What is claimed is:

1. An asymmetric bidirectional silicon-controlled rectifier comprising:
    a substrate of a second conduction type;
    a first conduction type structure formed on said substrate;
    a first well and a second well both being of said second conduction type, formed inside said first conduction type structure and separated by a portion of said first conduction type structure;
    a first buried layer and a second buried layer with opposite conduction type respectively formed on bottoms of said first well and said second well;
    a first semiconductor area and a second semiconductor area with opposite conduction type formed inside said first well; and
    a third semiconductor area and a fourth semiconductor area with opposite conduction type both formed inside said second well.

2. An asymmetric bidirectional silicon-controlled rectifier according to claim 1, wherein said first conduction type structure is an undoped epitaxial layer or a doped well.

3. An asymmetric bidirectional silicon-controlled rectifier according to claim 1, wherein a semiconductor area at said first well and near the portion of said first conduction type structure for separating said first well and said second well is said first semiconductor area or said second semiconductor area; a semiconductor area at said second well and near the portion of said first conduction type structure for separating said first well and said second well is said third semiconductor area or said fourth semiconductor area.

4. An asymmetric bidirectional silicon-controlled rectifier according to claim 1, which is formed via mirroring a half structure of said asymmetric bidirectional silicon-controlled rectifier with a mirror passing through a center of said first semiconductor area and further comprises: a fifth semiconductor area formed inside said first well and having a conduction type identical to that of said second semiconductor area, a third well, a third buried layer and two semiconductor areas formed inside said third well.

5. An asymmetric bidirectional silicon-controlled rectifier according to claim 1, wherein a first conduction type doped region is formed on a surface of said first conduction type structure between said first well and said second well.

6. An asymmetric bidirectional silicon-controlled rectifier according to claim 4, wherein a sixth semiconductor area and a seventh semiconductor area are respectively formed in a junction between said first well and said first conduction type structure and a junction between said second well and said first conduction type structure, and both said sixth and seventh semiconductor areas are of said first conduction type.

7. An asymmetric bidirectional silicon-controlled rectifier according to claim 4, wherein a sixth semiconductor area and a seventh semiconductor area are respectively formed in a junction between said first well and said first conduction type structure and a junction between said second well and said first conduction type structure, and both said sixth and seventh semiconductor areas are of said second conduction type.

8. An asymmetric bidirectional silicon-controlled rectifier according to claim 1, wherein said first semiconductor area and said second semiconductor area are connected to an anode; said third semiconductor and said fourth semiconductor area are connected to a cathode.

9. An asymmetric bidirectional silicon-controlled rectifier according to each of from claim 1, wherein said first buried layer is of said first conduction type, and said second buried layer is of said first conduction type or said second conduction type.

10. An asymmetric bidirectional silicon-controlled rectifier according to each of from claim 1, wherein a separation structure is formed between said semiconductor areas and is in a form of an oxide layer, a shallow trench, or an undoped semiconductor area.

* * * * *